(12) United States Patent
Zhang et al.

(10) Patent No.: US 6,327,690 B1
(45) Date of Patent: Dec. 4, 2001

(54) INTEGRATED REED-SOLOMON ERROR CORRECTION CODE ENCODER AND SYNDROME GENERATOR

(75) Inventors: Minda Zhang, Mesa; Brian Roger Mears, Tempe; Gregory Bradford Tucker, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/245,155

(22) Filed: Feb. 4, 1999

(51) Int. Cl.$^7$ .................................................. H03M 13/15
(52) U.S. Cl. ............................................ 714/769; 714/784
(58) Field of Search ...................................... 714/769, 784

(56) References Cited

U.S. PATENT DOCUMENTS

| | | | |
|---|---|---|---|
| 4,562,577 | * 12/1985 | Glover et al. | 371/38 |
| 4,777,635 | * 10/1988 | Glover | 371/40 |
| 5,323,402 | 6/1994 | Vaccaro et al. | 371/37.1 |
| 5,379,305 | 1/1995 | Weng | 371/41 |
| 5,383,204 | 1/1995 | Gibbs et al. | 371/37.7 |
| 5,396,502 | 3/1995 | Owsley et al. | 371/37.1 |
| 5,422,895 | 6/1995 | Nguyen et al. | 371/37.5 |
| 5,444,719 | 8/1995 | Cox et al. | 371/37.1 |
| 5,532,954 | 7/1996 | Bechtolsheim et al. | 365/52 |
| 5,689,727 | * 11/1997 | Bonke et al. | 395/840 |
| 5,778,009 | * 7/1998 | Fredrickson et al. | 371/37.1 |

* cited by examiner

Primary Examiner—Stephen M. Baker
(74) Attorney, Agent, or Firm—Blakely, Sokoloff, Taylor & Zafman LLP

(57) ABSTRACT

An execution unit that performs both Reed-Solomon Error Correction Code (R-S ECC) encoding and R-S ECC syndrome generation within a combinational circuit coupled between an input buffer and an output buffer.

21 Claims, 7 Drawing Sheets

INTEGRATED REED-SOLOMON ERROR CORRECTION CODE ENCODER AND SYNDROME GENERATOR

BACKGROUND OF THE INVENTION

1. Field of the Invention

The present invention relates generally to error correction codes and specifically to an execution unit adapted for Reed-Solomon Error Correction Code (R-S ECC) encoding and syndrome generation.

2. Background Information

Conventionally, Reed-Solomon Error Correction Code (R-S ECC) encoding and R-S ECC syndrome generation is accomplished by independent and separate circuits. For example, in Kuang Yung Liu, *Architecture for VLSI Design of Reed-Solomon Decoders,* IEEE Transactions on Computers, Vol. C-33, No. 2, (Febuary. 1984), the circuit illustrated is adapted for R-S ECC encoding, and the circuit shown in Kuang Yung Liu, *Architecture for VLSI Design of Reed-Solomon Encoders,* IEEE Transactions on Computers, Vol. C-31, No. 2, (Febuary 1982) is adapted for R-S ECC syndrome generation.

Since both R-S ECC encoding and R-S ECC syndrome generation are relatively complex operations, the hardware implementation of these operations typically requires a high number of logic circuits that occupy a correspondingly large, silicon die area. The disadvantages of providing separate circuits for encoding and for syndrome generation include the cost of the large, silicon die area as well as the high number of gates needed to implement both the circuits.

Accordingly, there is a need for an execution unit that performs both R-S ECC error encoding and R-S ECC syndrome generation while minimizing the number of transistors and logic circuits needed to implement the unit and minimizing the area this execution unit occupies on the silicon die.

SUMMARY OF THE INVENTION

An execution unit that performs both Reed-Solomon Error Correction Code (R-S ECC) encoding and R-S ECC syndrome generation within a combinational circuit coupled between an input buffer and an output buffer.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

In an exemplary embodiment, the R-S ECC encoding filter with syndrome calculation is integrated into a single execution unit as an Application Specific Unit (ASU) model for co-processor implementation. The ASU model may be a single instruction, multiple data (SIMD) execution engine that executes 8*(1 GF(256) Multiplication+2 GF(256) Add) in a cycle at 50 megahertz (MHz) resulting in 1200 million operations per second (MOPS). For example, the ASU model may be used in a Mentor Graphics Mistral 2 silicone compiler to create a co-processor for Error Correction Code (ECC). This ASU model of an exemplary embodiment may consist of three sections: the registers section (or storage unit), the core section, and the SWAP section. The registers section loads 128-bit data (e.g., 16 GF(256) data symbols). The core section has eight slices, where each slice contains a read-only memory (ROM) that stores partial results of GF(256) coefficients for R-S ECC and syndrome calculation and stores logic circuitry for 1 GF(256) multiply and 2 GF(256) adds. The SWAP section arranges all 128-bit output to feedback to input E (during encoding mode) or input S (during syndrome generation mode)

Figure 1:
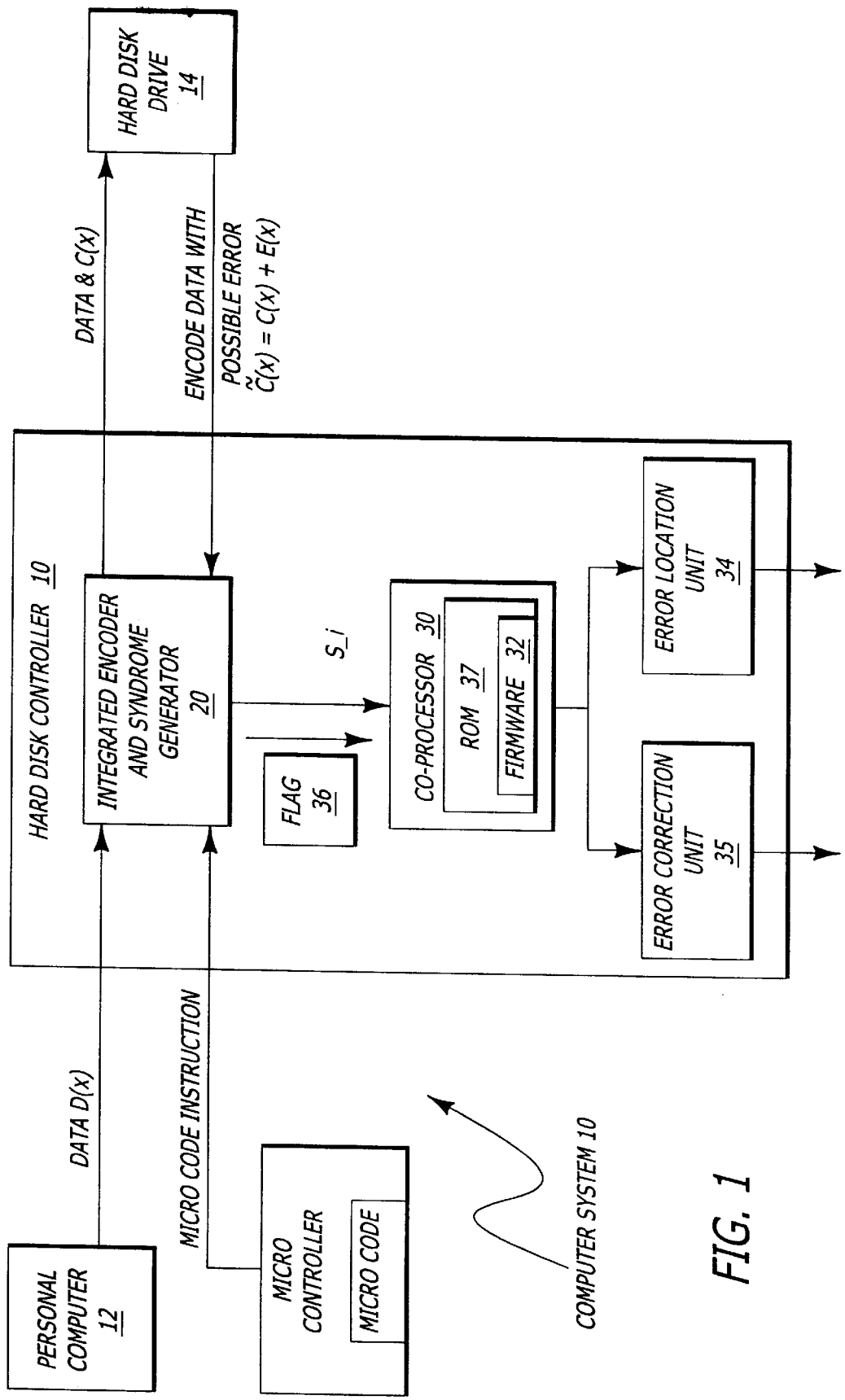
FIG. 1 illustrates a computer system in which the present invention may be implemented.

FIG. 1 illustrates computer system 10 in which the present invention may be implemented. This system includes hard disk controller (HDC) 11 that is interposed between personal computer (PC) 12 and hard disk drive (HDD) 14. Although the present invention is described as part of a hard disk controller, it will be evident to those skilled in the art that hard disk drive 14 may be any storage media and hard disk controller 11 may be any controller associated with controlling hard disk drive 14. Moreover, hard disk drive 14 may itself be a communication channel such as a wireless link between two base stations.

HDC 11 includes integrated encoder and syndrome generator 20 of the present invention. Integrated encoder and syndrome generator 20 operate in an encoding mode or a syndrome generation mode. In the form of select signal 106, micro code instruction 13 from micro code 15 embedded within micro controller 17 informs integrated encoder and syndrome generator 20 of the mode of the operation or "mode setting." Micro controller 17 may also determine whether integrated encoder and syndrome generator 20 is active or inactive and may send micro code instruction 13 in the form of a permit signal to enable or prevent integrated encoder and syndrome generator 20 from receiving incoming signals.

During encoding mode, integrated encoder and syndrome generator 20 receives data D(x) from PC 12 and generates a code polynomial C(x) and provides that to HDD 14. The code polynomial C(x) may be simply the data D(x) with appended parity symbols (also referred to as check bits). The appended parity symbols constitute the parity polynomial P(x) and may be generated by performing a modulation (mod) between the data D(x) and a pre-selected generating polynomial G(x).

During syndrome generation mode, the integrated encoder and syndrome generator 20 receives a modified code polynomial $\tilde{C}$ (x) from HDD 14. The modified code polynomial $\tilde{C}$ (x) may include an error term E(x) that represents possible error injected into the code polynomial C(x) as the data may be written to and read from HDD 14 such that $\tilde{C}$ (x)=C(x)+E(x). Accordingly, an error correction system may be a needed component of HDC 11. Thus, on receiving the modified code polynomial $\tilde{C}$ (x) from HDD 14, the integrated encoder and syndrome generator 20 generates syndrome S_i and provides syndrome S_i to co-processor 30 within HDC 11. Co-processor 30 executes firmware 32 adapted specifically for performing the operations of the HDC 11.

The syndromes are provided to firmware 32 coupled to both error location unit 34 and error correction (evaluation) unit 35. Error location unit 34 and error correction unit 35 are each implemented by firmware code included within ROM 37 of FIG. 1, executing on co-processor 30. Firmware 32 calculates error location within error location unit 34 and error correction within error correction unit 35 based upon the syndromes (S_i) generated by integrated encoder and syndrome generator 20 of the present invention.

Integrated encoder and syndrome generator 20 may also communicate flag 36 to co-processor 30. Communicated flag 36 indicates to co-processor 30 that there are no errors in the received modified code polynomial $\tilde{C}$ (x) such that $\tilde{C}$ (x)=C(x) because E(x)=0. Obviously, this flag could be implemented as a signal to interrupt co-processor 30.

Figure 2:
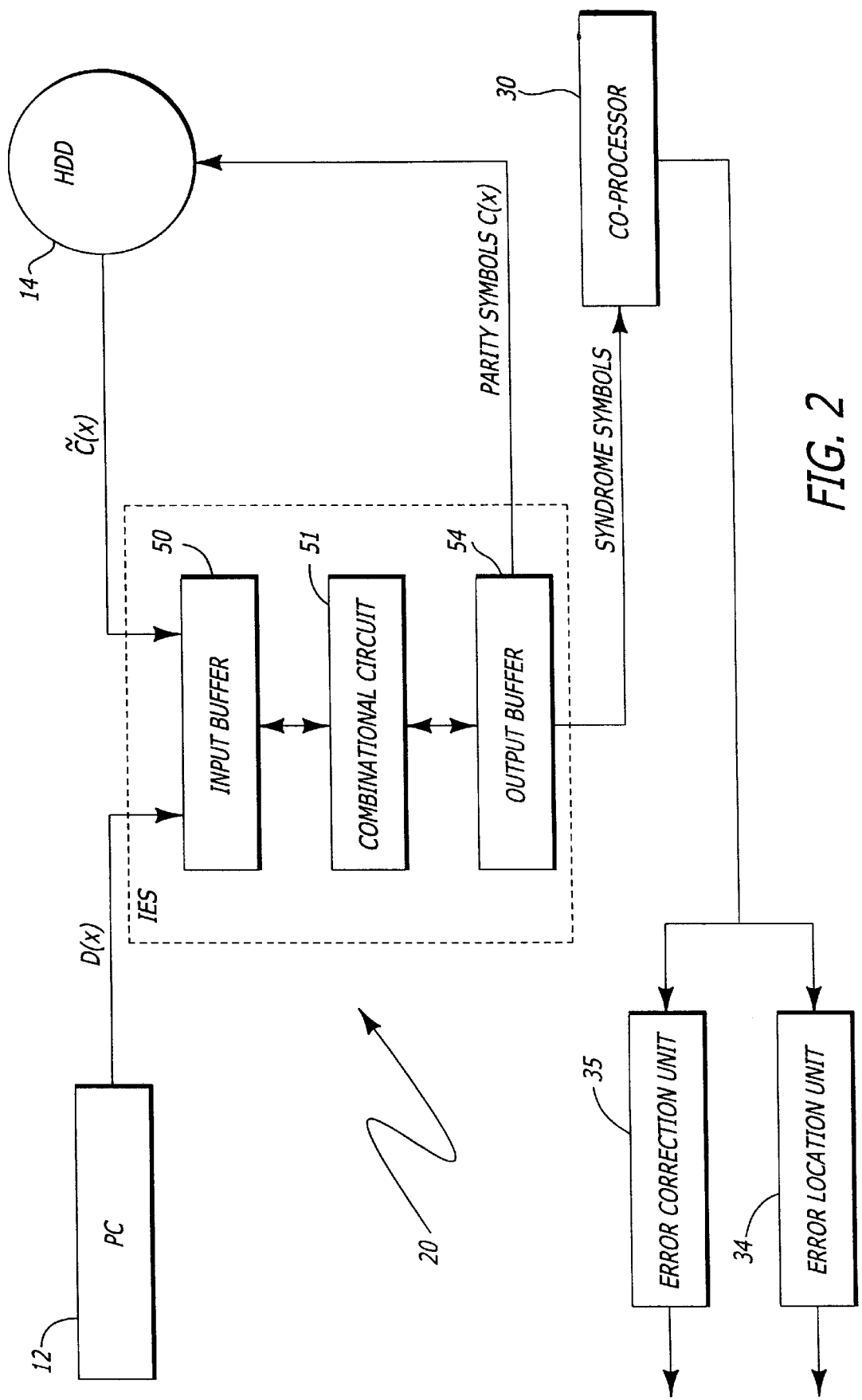
FIG. 2 is a block diagram illustrating in greater detail an integrated encoder and syndrome (IES) generator of the invention.

FIG. 2 is a block diagram illustrating in greater detail integrated encoder and syndrome (IES) generator 20 of the present invention. Integrated encoder and syndrome generator 20 includes an input buffer 50 that receives either data symbols representing coefficients of a data polynomial D(x) from PC 12 or the data code symbols representing coefficients of a potentially corrupted code polynomial $\tilde{C}$ (x) from the HDD 14. Combinational circuit 51 operates input buffer 50 as well as output buffer 54. Output buffer 54 receives the symbols from combinational circuit 51 and transmits either syndrome symbols to co-processor 30 or parity symbols that, when appended to the data polynomial D(x), form the code polynomial C(x) transmittal to HDD 14.

Figure 3:
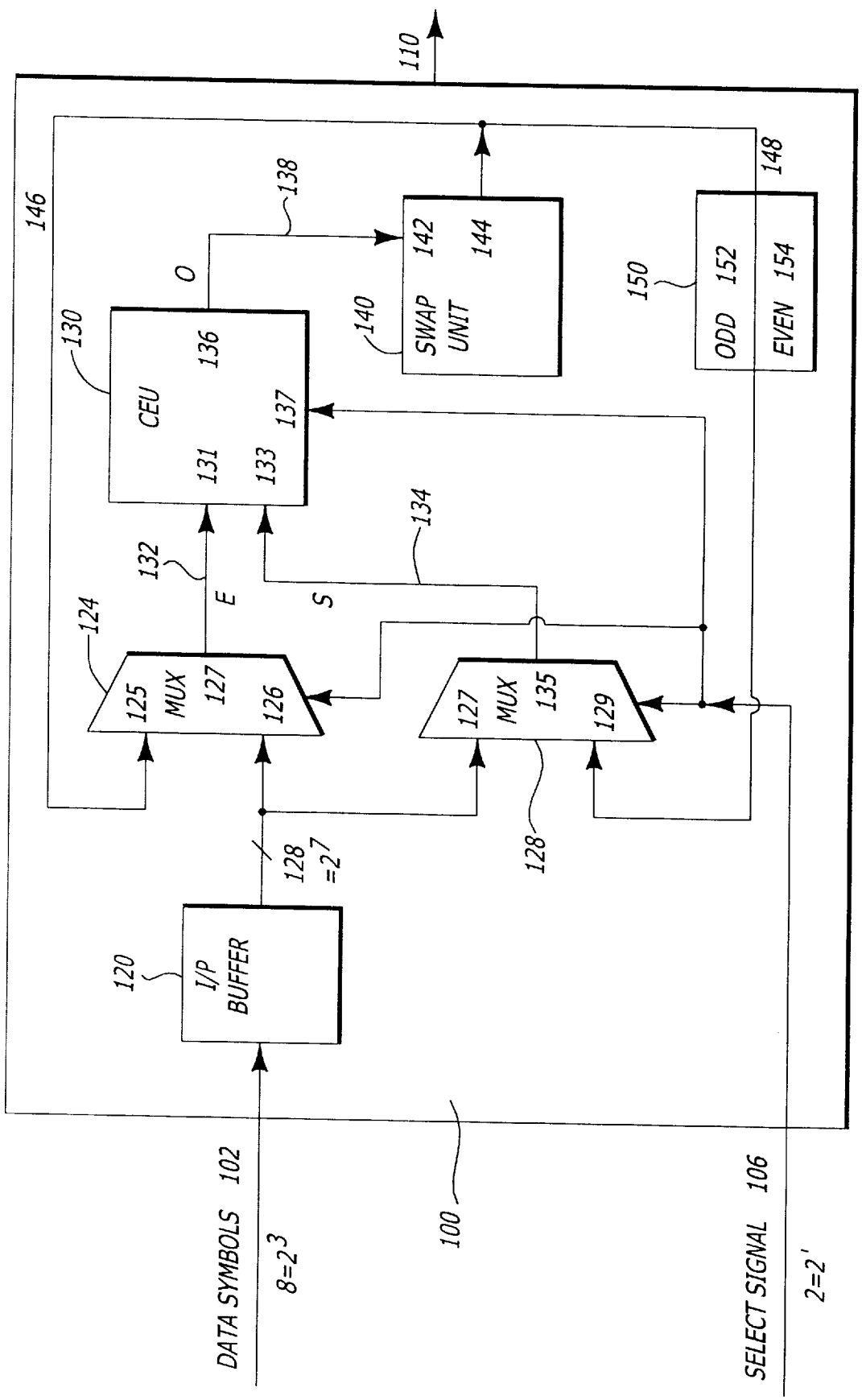
FIG. 3 illustrates a simplified block diagram of a Reed-Solomon Error Correction Code system dedicated to both encoding and syndrome generation configured in accordance with one embodiment of the present invention.

FIG. 3 illustrates a simplified block diagram of the Reed-Solomon Error Correction Code system dedicated to both encoding and syndrome generation configured in accordance with one embodiment of the present invention. Integrated system 100 may include first input 102 for receiving M data symbols during encoding and N data symbols during syndrome generation. In one embodiment M equals 171, and N equals 187. Each data symbol may include P bits. In one embodiment each symbol has 8 bits (e.g., P=8) as shown in FIG. 3. First input 102 either receives data symbols corresponding to coefficients in a data polynomial D(x) for encoding as shown in FIG. 3 or receives code symbols corresponding to coefficients of a potentially corrupted code polynomial $\tilde{C}$ (x) for syndrome generation. Input (I/P) buffer 120 receives the 8 bit data symbol, makes sixteen copies of the input 8-bit data symbol, and copies each of the sixteen, 8 bit data symbols into 128 bits as shown in FIG. 3.

Integrated system 100 includes first multiplexer (mux) 124 having first input 125 for receiving intermediate results for parity symbols from swap unit output 144 through bus 146 during the encode stage (indicated as (e) in FIG. 3), and second input 126, coupled to input buffer 120, for receiving the 128 bit data during syndrome generation stage (indicated as (s) in FIG. 3). First multiplexer 124 includes a third input that is coupled to second input 106 of integrated system 100. Second input 106 of integrated system 100 receives a select signal from micro controller 17 of FIG. 1 that indicates to integrated system 100 one of the two desired operations. These two operations or modes include encoding and syndrome generation. The select signal selects internal memory (e.g., ROM) 336 in primary execution unit 210 of FIG. 6 constant symbols used either for encoding or symbol generation.

Integrated system 100 includes second multiplexer 128. Second multiplexer 128 has first input 127 coupled to input buffer 120 for receiving data symbols for the encoding mode, a second input 129 coupled to swap unit output 144 through bus 148, for receiving intermediate results for syndrome symbols during the syndrome generation mode, and a third input coupled to second input 106 of integrated system 100 for receiving the select signal. Second multiplexer 128 selectively provides either the 128 bit data from input buffer 120 or the intermediate syndrome symbols from swap unit 140 based on the select signal from second input 106. Similarly, first multiplexer 124 selectively provides either the 128 bit intermediate parity symbols from input 125 or the 128 bit data from input 126 based on the select signal from second input 106.

During encoding, first input 102 receives data symbols corresponding to coefficients of a data polynomial. Based on these data symbols, coefficients of a generating polynomial, and the select signal, core execution unit (CEU) 130 in conjunction with swap unit 140 generates a plurality of parity symbols at output 110 of integrated system 100 that correspond to coefficients of a parity polynomial. Specifically, in this embodiment, integrated system 100 in the encoding stage, generates sixteen parity symbols from the 8 bit data symbol.

During encoding, first multiplexer 124 selects the intermediate results for parity symbols provided by swap unit output 144, thereby establishing a feedback path between swap unit output 144 and CEU 130. Second multiplexer 128 selects the 128 bit data from input buffer 120. It should be noted that in the encoding stage, the path between swap output unit 144 and second input 129 of second multiplexer 128 may be disabled.

During syndrome generation, the data symbols received may be potentially corrupted code symbols. In this embodiment, there are 187 potentially corrupted code symbols (N=187) where output 110 provides sixteen syndrome symbols. Second multiplexer 128 selects the intermediate results for syndrome symbols thereby establishing a feedback path between swap unit output 144 and CEU 130. It should be noted that during syndrome generation, the path between swap unit output 144 and first input 125 of first multiplexer 124 may be deselected.

The output of first multiplexer 124 is coupled to wide bus (denoted E for "encoding") 132, and the output of second multiplexer 128 is coupled to second wide bus (denoted S for "syndrome") 134. Wide bus E 132 and wide bus S 134 include a plurality of narrow buses, with each narrow bus including a plurality of bits. In this embodiment, each wide bus may include sixteen (16) narrow buses, and each narrow bus may include eight (8) bits. Accordingly, first wide bus E 132 and second wide bus S 134 each include 128 bits of data.

Having inputs E and S, core execution unit 130 calculates either the parity symbols or the syndrome symbols based on the select signal from second input 106. Core execution unit (CEU) 130 includes first input 131 coupled to first wide bus E 132, second input 133 coupled to second wide bus S 134, and output 136 which may be coupled to third wide bus (denoted O for "output") 138. Core execution unit 130 also includes an input 137 for receiving the select signal from second input 106. Core execution unit 130 will be described in greater detail hereinafter with reference to FIG. 4.

The calculation from core execution unit 130 is communicated to swap unit 140 through third wide bus O 138. Swap unit 140 includes input 142 for receiving the communication from third wide bus O 138 of core execution unit 130. Swap unit 140 formats third wide bus O 138 to conform with the format of first wide bus E 132 and second wide bus S 134. Swap unit 140 includes swap unit output 144 that is coupled to first multiplexer 124 and second multiplexer 128. Swap unit 140 will be described in greater detail hereinafter with reference to FIG. 5. The predetermined format of first wide bus E 132, second wide bus S 134, and third wide bus O 138 will be described in greater detail hereinafter with reference to FIG. 4.

Integrated system 100 also may include memory 150 that includes odd register 152 and even register 154. Integrated system 100 employs memory 150 during syndrome generation. As will be described in greater detail regarding Tables 1 and Table 2 below, integrated system 100 employs two cycles to process each potentially corrupted code symbol during syndrome generation. The intermediate syndrome symbols from odd cycles are stored in odd register 152 and the intermediate syndrome symbols from an even cycle are stored in even register 154.

Table 1 below illustrates the state of first wide bus E 132, second wide bus S 134, and swap unit output 144, during the encoding for one embodiment of the present invention. Swap unit output 144 may also be a wide bus. Integrated system 100 includes first input 102 for receiving M data symbols during encoding and N data symbols during syndrome generation. In one embodiment M equals 171, and N equals 187. For 171 data symbols during encoding (D0 to D170), 171 bus cycles (0 to 170) may be needed to generate sixteen parity symbols (PAR171) from these 171 data symbols. At the 171st bus cycle (bus cycle #170), OUT 110 (system output 110 of FIG. 3) contains PAR171 which is sixteen parity symbols while PAR1–PAR170 are intermediate parity symbols (e.g., intermediate values used by CEU 130 of FIG. 3 to derive PAR171).

TABLE 1

| BUS CYCLE # | 0 | 1 | 2 | 3 | ... | 170 |
|---|---|---|---|---|---|---|
| E 132 | 0 | PAR1 | PAR2 | PAR3 | ... | PAR170 |
| S 134 | D0 | D1 | D2 | D3 | ... | D170 |
| 144 | PAR1 | PAR2 | PAR3 | PAR4 | ... | PAR171 |
| OUT 110 | | ... | | ... | | PAR171 |

Table 2 below illustrates the state of first wide bus E 132, second wide bus S 134, and output 110 during the syndrome generation of one embodiment of the present invention. Output 110 may also be a wide bus. From 187 potential corrupted code symbols (C0 to C186) during syndrome generation, 374 bus cycles (0 to 373) are needed to generate sixteen syndrome symbols from these 187 potentially corrupted code symbols. SYN373 and SYN374 each represent eight syndrome symbols for a total of sixteen syndrome symbols while SYN1–SYN372 represent intermediate syndrome symbols that are employed by CEU 130 of FIG. 3 to derive SYN373

TABLE 2

| BUS CYCLE | 0 | 1 | 2 | 3 | ... | 372 | 373 |
|---|---|---|---|---|---|---|---|
| E 132 | C0 | C0 | C1 | C1 | ... | C186 | C186 |
| S 134 | 0 | 0 | SYN1 | SYN2 | ... | SYN371 | SYN372 |
| 144 | SYN1 | SYN2 | SYN3 | SYN4 | ... | SYN373 | SYN374 |
| ODD 152 | | ODD | | ODD | | | ODD |
| EVEN 154 | EVEN | | EVEN | | | EVEN | |
| OUT 110 | | | | | | SYN373 | SYN374 |

Figure 4:
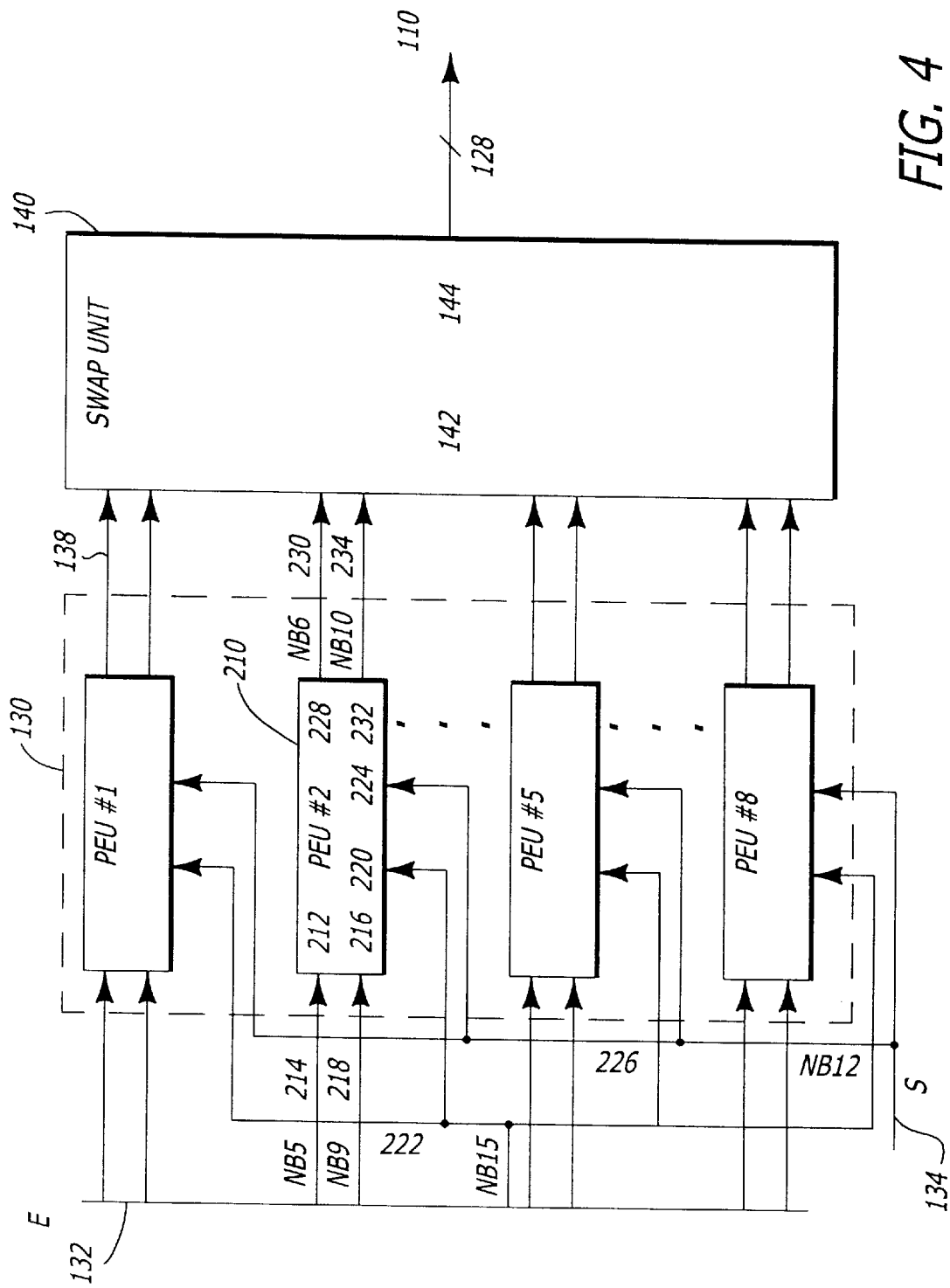
FIG. 4 illustrates a simplified block diagram of the core execution unit of FIG. 3 for one embodiment of the present invention.

FIG. 4 illustrates a simplified block diagram of the core execution unit 130 of FIG. 3 for one embodiment of the present invention. Core execution unit 130 selectively generates parity symbols or syndrome symbols based on the select signal 106 as shown in FIG. 3. Core execution unit 130, shown within broken lines in FIG. 4, either generates parity symbols based on data symbols and coefficients of the generating polynomial, or generates syndrome symbols based on potentially corrupted code symbols and the roots of the generating polynomial.

Core execution unit 130 may include a plurality of primary execution units 210. In this embodiment, the core execution unit 130 includes eight primary execution units 210. Each primary execution unit (PEU) 210 includes four inputs, three of which are coupled to first wide bus E 132 and the remainder of which are coupled to second wide bus S 134.

In reference to the PEU 210 identified as PEU #2, first input 212 is coupled to first wide bus E 132 for receiving the data bits of first narrow E bus 214 designated as NB5 (denoted NB for "narrow bus"). Second input 216 is likewise coupled to first wide bus E 132 for receiving the data bits of second narrow E bus 218 designated NB9. Third input 220 is coupled to first wide bus E 132 for receiving data bits of third narrow E bus 222 designated NB15. Last, fourth input 224 is coupled to second wide bus S 134 for receiving data bits of first narrow S bus 226 designated NB12.

In response to these four inputs, PEU #2 of primary execution unit 210 generates a first symbol at first output 228 and a second symbol at second output 232. First output 228 and second output 232, similar to the other outputs of the other PEUs, is coupled to third wide bus O 138 through a plurality of narrow O buses. Specifically, first output 228 is coupled to first narrow O bus 230 designated NB6 and second output 232 is coupled to second narrow bus 234 designated NB10. These plurality of narrow O buses are coupled to swap unit 140 at input 142, as shown in FIG. 4.

During the encoding stage, first input 212, second input 216, and third input 220 receive intermediate results for parity symbols from first wide bus E 132 through their associated narrow E bus, NB5, NB9, and NB15, respectively. Meanwhile, fourth input 224 receives data symbols corresponding to the coefficients of the data polynomial from second wide bus S 134 through its associated narrow S bus, NB12. Intermediate results for parity symbols are generated by first output 228 on narrow bus 230 and by second output 232 on narrow bus 234. After processing all the incoming data symbols, first output 228 and second output 232 generate two of the sixteen parity symbols for input 142, where input 142 receives wide bus O 138 of core execution unit 130.

During syndrome generation, first input 212 of PEU #2 receives the data from narrow E bus 214 (NB5), whereas second input 216 receives the data from narrow E bus 218 (NB9). The values on narrow bus NB5 and NB9 may be the same as that which represents one of the coefficients of the modified code polynomial. Third input 220 is coupled to narrow E bus 222 to receive a zero value from first wide bus E 132 through NB15. NB15 may transmit a different value from NB5 and NB9 since each of these three narrow buses (e.g., 8-bit wide) receive their value from first wide bus E 132 (e.g., 128-bit wide), where first wide bus E 132 prepares these individual values in accordance with the discussion regarding FIG. 5, for example. Fourth input 224 is coupled to narrow bus 226 to receive intermediate results for syndrome symbols from second wide bus S 134 through NB12.

During syndrome generation, PEU #2 of PEU 210 consecutively executes twice to generate two sets of intermediate results for syndromes for each incoming code symbol from wide bus S 134. The intermediate syndrome symbols from odd cycles may be stored in odd register 152 and the intermediate syndrome symbols from an even cycle may be stored in even register 154. The two sets of intermediate results for syndromes may be labeled as odd/even serial numbers for SYN as shown in Table 2 above. These intermediate results are eventually be fedback into wide bus E 132 from one of the two PEU 210 outputs (e.g., NB6, or NB10 of FIG. 4) as indicated in FIG. 3. Moreover, the unused PEU 210 output port may be disabled during the syndrome generation. After PEU 210 executes the last code symbol, wide bus O 138 is ready to provide two sets of the syndromes. In this embodiment, each set includes eight syndromes for a total of sixteen syndrome symbols as set out in Table 2.

Figure 5:
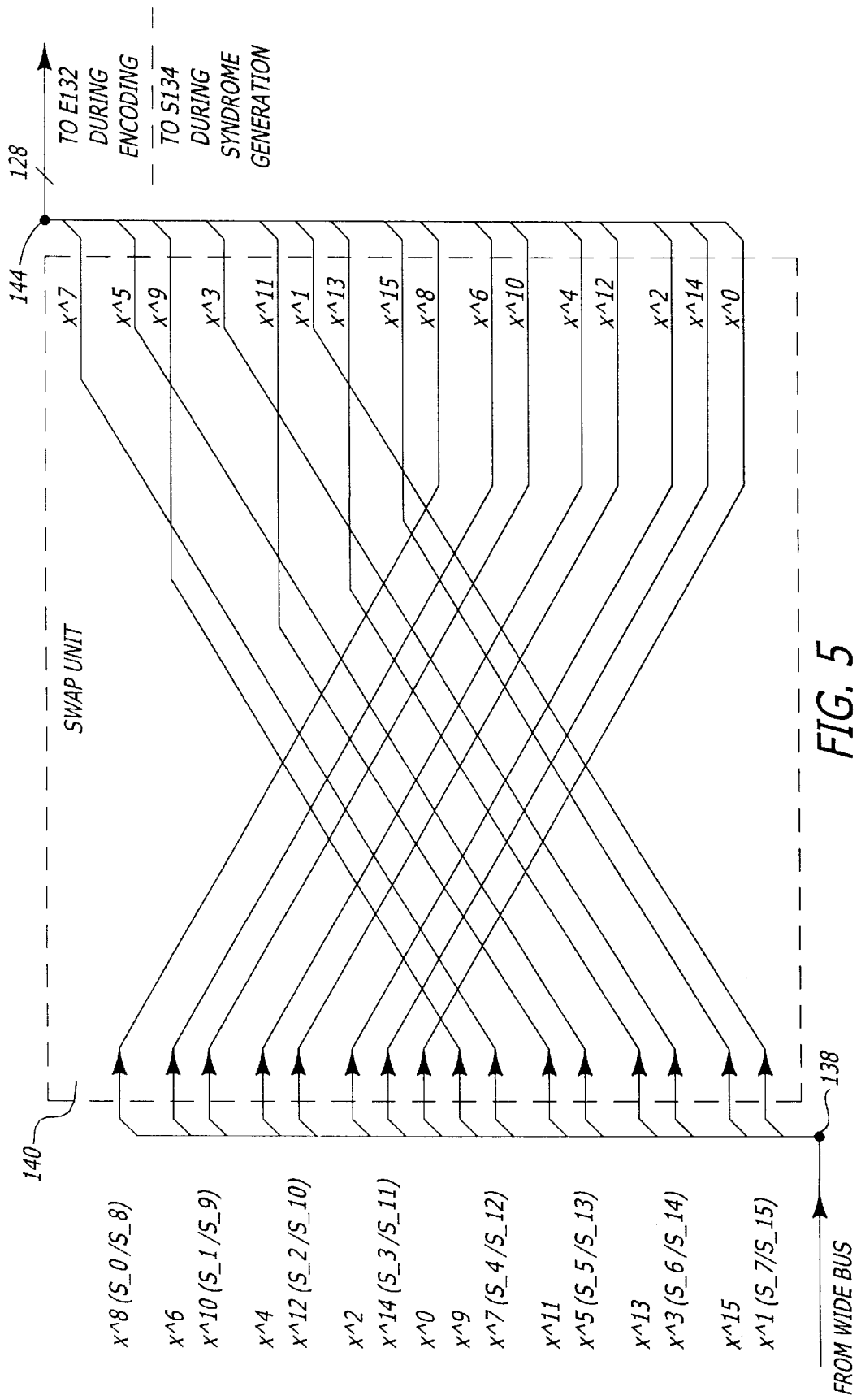
FIG. 5 illustrates a first wide bus E, a second wide bus S, a third bus O and a swap unit of FIG. 4.

FIG. 5 illustrates in greater detail first wide bus E 132, second wide bus S 134, third wide bus O 138 and swap unit 140 of FIG. 4. As shown in FIG. 3, output 136 of core execution unit 130 is coupled to third wide bus O 138. From FIG. 4, it can be seen that third wide bus O 138 includes a plurality of narrow buses. These narrow buses may be configured in a third predetermined order that is different from the arrangement configuration of first wide bus E 132 and second wide bus S 134. In other words, the narrow buses in first wide bus E 132 may be configured in a first predetermined order, and the narrow buses in the second wide bus S 134 may be configured in a second predetermined order. The third predetermined order of the narrow buses in third wide bus O 138 may be different from the first and second predetermined order. Thus, FIG. 5 illustrates how swap unit 140 reorders the output of CEU 130 from a third predetermined order so that the output of CEU 130 is adapted to coincide with a first predetermined order of first wide bus E 132 during encoding and a second predetermined order of second wide bus S 134 during syndrome generation.

Swap unit 140 of FIG. 5 includes first input 142 coupled to third wide bus O 138 for receiving data symbols grouped in narrow buses configured in accordance with the third predetermined order. Swap unit 140 includes swap unit output 144 that is coupled to first wide bus E 132 through bus 146 and multiplexer 124 and coupled to second wide bus S 134 through bus 148 and multiplexer 124. Swap unit 140 receives the data symbols arranged in the third predetermined order. With the data symbols arranged in the third predetermined order, swap unit 140 maps or reassigns the narrow buses into a first predetermined order during the encoding stage and maps or reassigns the narrow buses into a second predetermined order during the syndrome generation stage. In other words, during the encoding stage, swap unit 140 effectively reorders the third predetermined order data on third wide bus O 138 into a first predetermined order compatible with the narrow bus arrangement on first wide bus E 132. Similarly, with the data grouped as narrow buses in a third predetermined order on third wide bus O 138, swap unit 140 effectively reorders this data into an order that conforms to the second predetermined order of second wide bus S 134.

Figure 6:
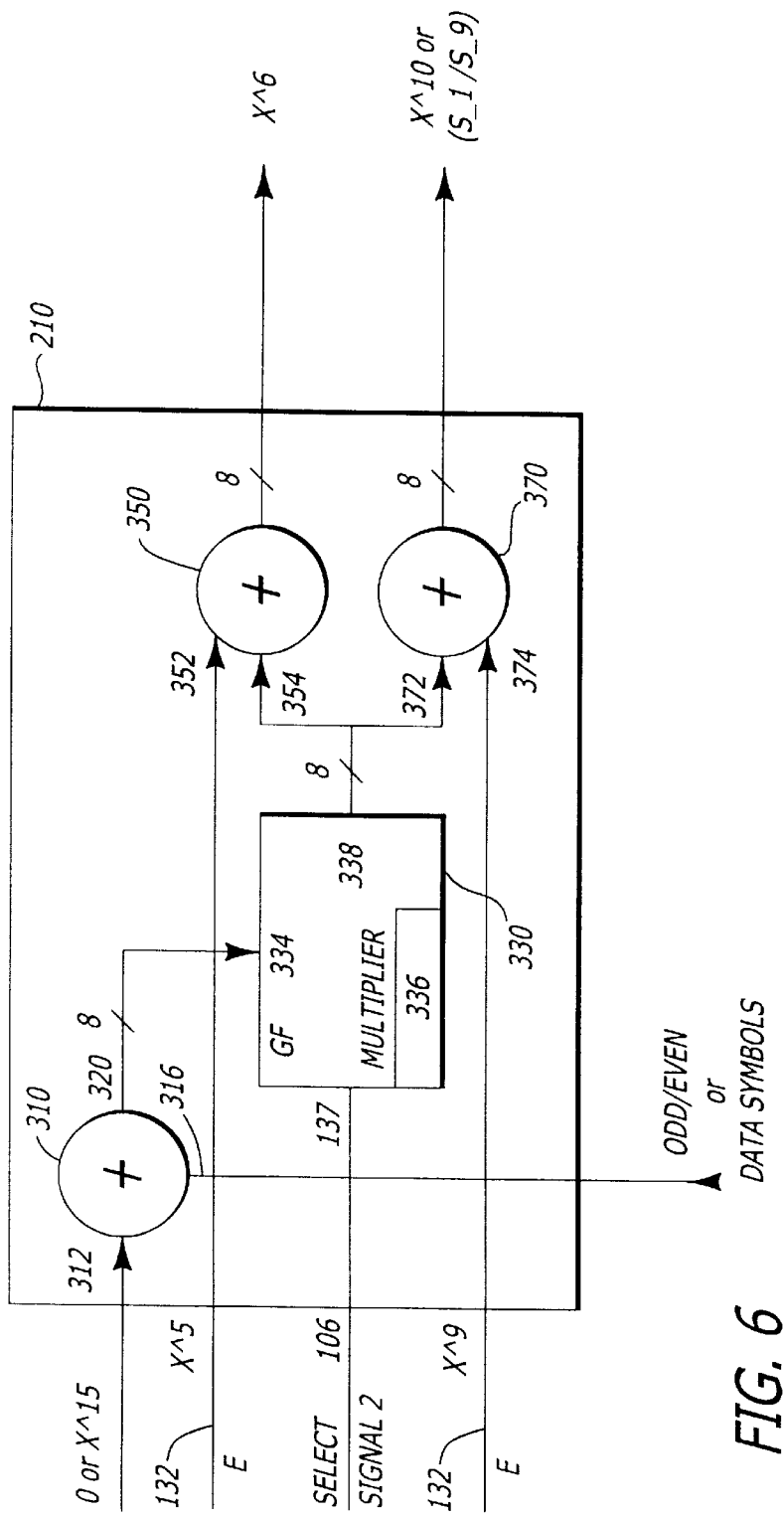
FIG. 6 illustrates a primary execution unit of FIG. 4 configured in accordance with one embodiment of the invention.

FIG. 6 illustrates in greater detail primary execution unit (PEU) 210 of FIG. 4 configured in accordance with one embodiment of the present invention. Primary execution unit 210, such as PEU #2 of FIG. 4, includes first Galois Field (GF) adder 310 having first input 312 for receiving a first operand and second input 316 for receiving a second operand, where each operand may be an eight bit number as indicated in FIG. 6. First GF adder 310 includes output 320 for generating the GF sum of the first and second operands. First input 312 may receive a zero (0) value during syndrome generation and may receive the intermediate result for parity symbol $X^{15}$ during encoding. Second input 316 may receive either intermediate results for syndromes corresponding to a syndrome in either the odd or even set of SYN (e.g., S_2 or S_10) during syndrome generation, or may receive data symbols from second wide bus S 134 during encoding.

Primary execution unit 210 includes a Galois Field (GF) multiplier 330 having first input 334 for receiving a first operand (e.g., eight bit data) from first GF adder 310 through output 320. GF multiplier 330 includes internal memory (e.g., ROM) 336 for providing a second operand such as constant symbols. Select signal 106 of integrated system 100 shown in FIG. 3 are used to select one set of constants of internal memory 336 for encoding or syndrome generation through input 137. GF multiplier 330 includes output 338 and generates a GF product (e.g., eight bit data) at output 338.

PEU 210 also includes second GF adder 350 having first input 352 and second input 354. First input 352 is coupled to first wide bus E 132 for receiving a narrow bus corresponding to an intermediate result for parity symbol (e.g., $X^5$) during encoding or for receiving a potentially corrupted code symbol during syndrome generation. Input 354 is coupled to receive the output of GF multiplier 330. Second GF adder 350 may generate the GF sum of the data bits received from first input 352 and second input 354.

Specifically, second GF adder 350 generates an intermediate result for parity symbol (e.g., intermediate X^6) or the parity symbol result (X^6) at the final iteration.

PEU 210 of FIG. 6 also includes third GF adder 370 having first input 372 and second input 374. First input 372 is coupled to receive the output of GF multiplier 330, and second input 374 is coupled to first wide bus E 132 to receive a narrow bus (e.g., the narrow bus corresponding to X^9) that represents an intermediate parity symbol during encoding and a potentially corrupted code symbol during signal generation. In response to these inputs, third GF adder 370 generates a sum (e.g., an eight bit data) that corresponds to an intermediate result for parity symbol (e.g., an intermediate result for parity symbol related to X^10), or an intermediate result for syndrome (e.g., an intermediate result for syndrome related to either S_1 or S_9), or the final results of the parity symbols and syndromes during the appropriate final bus cycles during encoding and syndrome generation.

Figure 7:
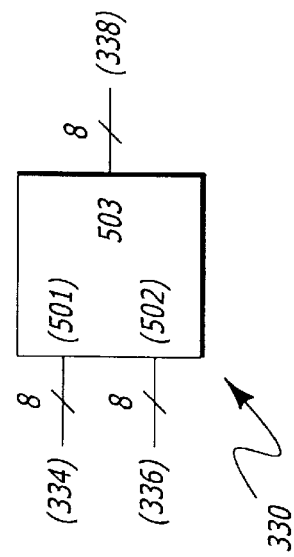
FIG. 7 illustrates how a GF multiplier of FIG. 6 may be configured as a variable GF multiplier in accordance with one embodiment of the invention.

FIG. 7 illustrates how GF multiplier 330 of FIG. 6 may be configured as a variable GF multiplier in accordance with one embodiment of the present invention. For example, a variable GF adder includes a first input and a second input that both receive data having the same number of bits. In this embodiment, the first input and the second input of the variable GF adder includes eight bits. Accordingly, memory 336 associated with a variable GF multiplier includes data for the second input, where each data includes the same number of bits as the first input.

In particular to FIG. 7, the variable GF multiplier includes first input 501 for receiving an 8-bit wide data from first input 334 and includes second input 502 for receiving an 8-bit constant stored in internal memory 336. Included with GF multiplier 330 may be output 503 leading to output 338 for the GF product of the two input operands.

Figure 8:
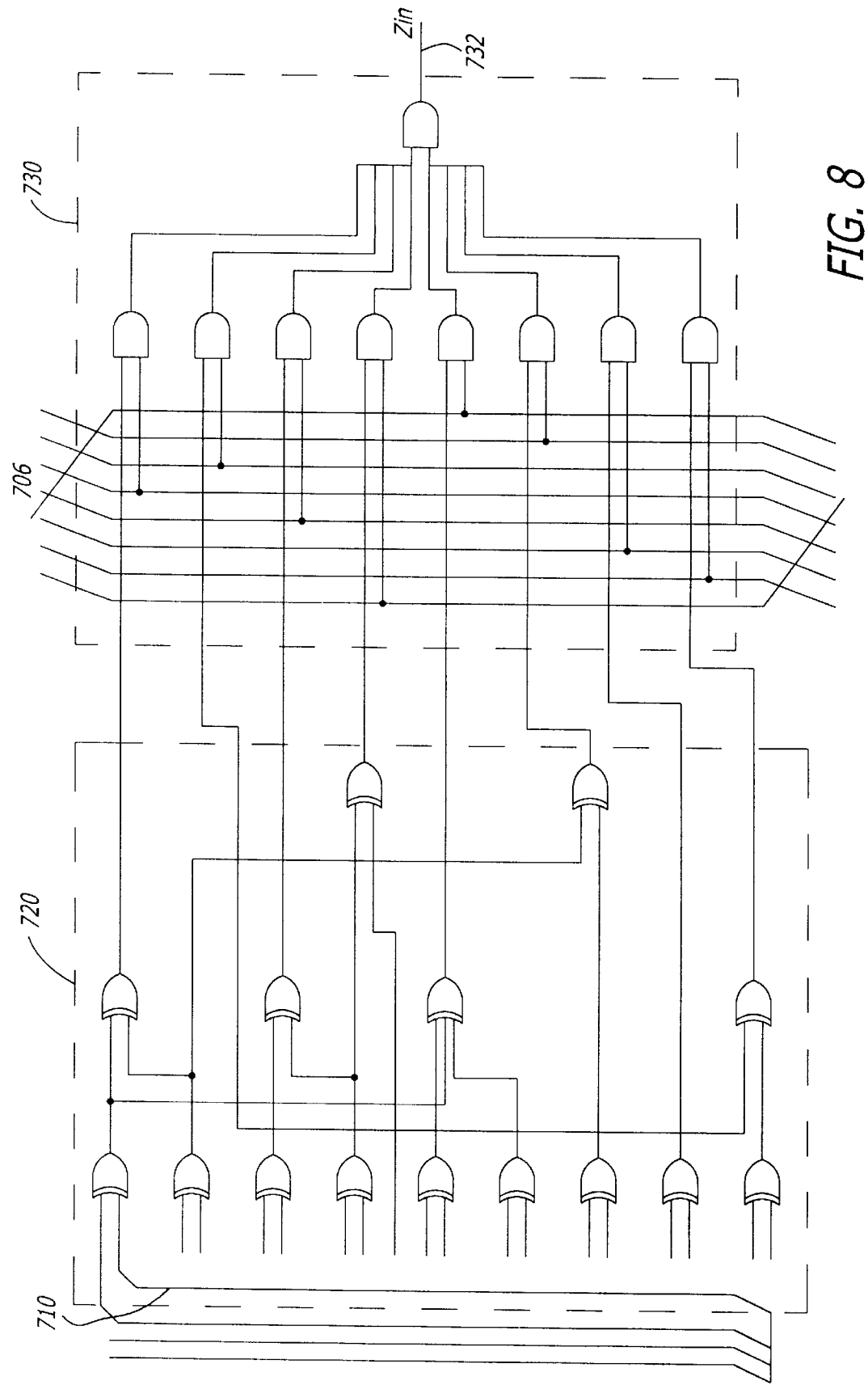
FIG. 8 illustrates how GF multiplier of FIG. 6 may be configured as a fixed GF multiplier in accordance with a preferred embodiment of the present invention.

FIG. 8 illustrates how GF multiplier 330 of FIG. 6 may be configured as a fixed GF multiplier in accordance with a preferred embodiment of the present invention. The primary difference between a fixed GF multiplier and a variable GF multiplier is that the first operand and the second operand of fixed GF multiplier may have a different number of bits. In this case, the first operand includes 64 bit data 710 received from memory 336 shown in FIG. 6. In contrast to the symmetric GF multiplier, the memory for the fixed multiplier case includes entries having 64 bits (or bit size that may be different from the first operand). The second operand may be eight bits in size and received at first input 706.

The fixed multiplier includes up stream unit 720 that generates an eight bit data in response to the data from internal memory 336, where the eight bit data may be passed to down stream unit 730. On receiving the output of up stream unit 720 and first operand 706, down stream unit 730 generates one bit at output 732. Output 732 generates one bit of the GF product and transmits this one bit of the GF product to output 336 of FIG. 6.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. An encoder and syndrome generator integrated in a Reed-Solomon error correction code unit, the unit comprising:

an input buffer having an output;

an output buffer; and a combinational circuit coupled between the input buffer and the output buffer, the combinatorial circuit comprising:

means for multiplexing having a first input, a second input, a first output, and a second output, the means for multiplexing coupled to the output of the input buffer;

a core execution unit having an output, the core execution unit coupled to the first output and the second output of the means for multiplexing;

a swap unit having an output, the swap unit coupled to the output of the core execution unit, the output of the swap unit coupled to the first input of the means for multiplexing and coupled to the second input of the means for multiplexing through a memory, and a select signal bus coupled to the means for multiplexing and to the core execution unit.

2. The unit of claim 1 wherein the means for multiplexing comprises:

a first multiplexer having an output, the first multiplexer coupled to the output of the input buffer, and a second multiplexer having an output, the second multiplexer coupled to the output of the input buffer, wherein the core execution unit is coupled to the output of the first multiplexer and coupled to the output of the second multiplexer, the output of the swap unit is coupled to the first multiplexer and coupled to the second multiplexer through the memory, and the select signal bus is coupled to the first multiplexer and to the second multiplexer.

3. The unit of claim 2, wherein the core execution comprises:

a plurality of primary execution units, each primary execution having a first input, a second input, and a third input coupled to the first multiplexer, and having a fourth input coupled to the second multiplexer.

4. The unit of claim 3, wherein each primary execution unit comprises:

a first Galois Field adder having an output, the first Galois Field adder coupled to the first input and the fourth input of the primary execution unit;

a Galois Field multiplier having an output, the Galois Field multiplier coupled to the select signal and coupled to the output of the first Galois Field adder;

a second Galois Field adder coupled to the second input of the primary execution unit and coupled to the output of the Galois Field multiplier; and a third Galois Field adder coupled to the third input of the primary execution unit and coupled to the output of the Galois Field multiplier.

5. The unit of claim 4 wherein the Galois Field multiplier is a variable Galois Field multiplier.

6. The unit of claim 4 wherein the Galois Field multiplier is a fixed Galois Field multiplier.

7. The unit of claim 2 wherein the output of the swap unit is coupled to the first multiplexer through a plurality of narrow buses configured in a first predetermined order, wherein the output of the swap unit is further coupled to the second multiplexer through a plurality of narrow buses configured in a second predetermined order, and wherein the swap unit is coupled to the output of the core execution unit through a plurality of narrow buses configured in a third predetermined order.

8. The unit of claim 2 wherein the first predetermined order is the same as the second predetermined order.

9. In a computer system having a hard disk controller coupled between a computer instrument and a hard disk drive, the hard disk controller having an integrated encoder and syndrome generator coupled to an error correction system, the integrated encoder and syndrome generator comprising:
an input buffer;
an output buffer; and
a combinational circuit coupled between the input buffer and the output buffer, the combinatorial circuit comprising:
means for multiplexing having a first input, a second input, a first output, and a second output, the means for multiplexing coupled to the output of the input buffer;
a core execution unit having an output, the core execution unit coupled to the first output and the second output of the means for multiplexing;
a swap unit having an output, the swap unit coupled to the output of the core execution unit, the output of the swap unit coupled to the first input of the means for multiplexing and coupled to the second input of the means for multiplexing through a memory; and
a select signal bus coupled to the means for multiplexing and to the core execution unit.

10. The system of claim 9 wherein the means for multiplexing is
a first multiplexer having an output, the first multiplexer coupled to the output of the input buffer and
a second multiplexer having an output, the second multiplexer coupled to the output of the input buffer, wherein
the core execution unit is coupled to the output of the first multiplexer and coupled to the output of the second multiplexer,
the output of the swap unit is coupled to the first multiplexer and coupled to the second multiplexer through the memory, and
the select signal bus is coupled to the first multiplexer and to the second multiplexer.

11. The system of claim 10, wherein the core execution comprises:
a plurality of primary execution units, each primary execution having a first input, a second input, and a third input coupled to the first multiplexer, and having a fourth input coupled to the second multiplexer.

12. The system of claim 11, each primary execution unit comprising:
a first Galois Field adder having an output, the first Galois Field adder coupled to the first input and the fourth input of the primary execution unit;
a Galois Field multiplier having an output, the Galois Field multiplier coupled to the select signal and coupled to the output of the first Galois Field adder;
a second Galois Field adder coupled to the second input of the primary execution unit and coupled to the output of the Galois Field multiplier; and
a third Galois Field adder coupled to the third input of the primary execution unit and coupled to the output of the Galois Field multiplier.

13. The system of claim 12 wherein the Galois Field multiplier is a variable Galois Field multiplier.

14. The system of claim 12 wherein the Galois Field multiplier is a fixed Galois Field multiplier.

15. The system of claim 10 wherein the output of the swap unit is coupled to the first multiplexer through a plurality of narrow buses configured in a first predetermined order, wherein the output of the swap unit is further coupled to the second multiplexer through a plurality of narrow buses configured in a second predetermined order, and wherein the swap unit is coupled to the output of the core execution unit through a plurality of narrow buses configured in a third predetermined order.

16. The system of claim 15 wherein the first predetermined order is the same as the second predetermined order.

17. A method for performing both Reed-Solomon Error Correction Code encoding and Reed-Solomon Error Correction Code syndrome generation within an execution unit having a combinational circuit coupled between an input buffer and an output buffer, the combinational circuit coupled to a select signal bus, the method comprising:
receiving a select signal on the select signal bus in the combinational circuit;
if the select signal indicates an encoding mode the method further comprises:
receiving data D (x) symbols in the combinational circuit through the input buffer; and
generating code polynomial C (x) in the combinational circuit;
if the select signal indicates a syndrome generation mode, the method further comprises:
receiving modified code polynomial C (x) symbols in the combinational circuit through the input buffer;
making multiple copies of the received symbols in the input buffer; and
generating syndrome S_i in the combinational circuit.

18. The method of claim 17 wherein generating code polynomial C (x) in the combinational circuit further comprises:
receiving, in a first multiplexer, intermediate results for parity symbols provided by a swap unit coupled to the first multiplexer;
transmitting the intermediate results for parity symbols to a core execution unit coupled to the first multiplexer;
receiving, in a second multiplexer, the data D (x) symbols;
transmitting the data D (x) symbols to the core execution unit coupled to the second multiplexer;
calculating parity symbols in the core execution unit; and transmitting the parity symbols to the swap unit coupled to the core execution unit.

19. The method of claim 18 wherein generating syndrome S_i in the combinational circuit further comprises:
receiving, in a first multiplexer, the modified code polynomial C (x) symbols;
transmitting the modified code polynomial C (x) symbols to a core execution unit coupled to the first multiplexer;
receiving, in a second multiplexer, intermediate results for syndrome symbols provided by a swap unit coupled to the second multiplexer,
transmitting the intermediate results for syndrome symbols to the core execution unit coupled to the second multiplexer;
calculating syndrome symbols in the core execution unit; and transmitting the syndrome symbols to the swap unit coupled to the core execution unit.

20. An encoder and syndrome generator integrated in a Reed-Solomon error correction code unit, the unit comprising:

an input buffer having an output;

an output buffer, and a combinational circuit coupled between the input buffer and the output buffer, the combinatorial circuit comprising:

a multiplexer having a first input, a second input, a first output, and a second output, the multiplexer coupled to the output of the input buffer;

a core execution unit having an output, the core execution unit coupled to the first output and the second output of the means for multiplexing;

a swap unit having an output, the swap unit coupled to the output of the core execution unit, the output of the swap unit coupled to the first input of the multiplexer and coupled to the second input of the multiplexer through a memory; and a select signal bus coupled to the multiplexer and to the core execution unit.

21. In a computer system having a hard disk controller coupled between a computer instrument and a hard disk drive, the hard disk controller having an integrated encoder and syndrome generator coupled to an error correction system, the integrated encoder and syndrome generator comprising:

an input buffer;

an output buffer, and a combinational circuit coupled between the input buffer and the output buffer, the combinatorial circuit comprising:

a multiplexer having a first input, a second input, a first output, and a second output, the multiplexer coupled to the output of the input buffer;

a core execution unit having an output, the core execution unit coupled to the first output and the second output of the multiplexer;

a swap unit having an output, the swap unit coupled to the output of the core execution unit, the output of the swap unit coupled to the first input of the multiplexer and coupled to the second input of the multiplexer through a memory; and a select signal bus coupled to the multiplexer and to the core execution unit.

\* \* \* \* \*